United States Patent
Allen, Jr. et al.

(10) Patent No.: US 6,792,389 B1
(45) Date of Patent: Sep. 14, 2004

(54) METHOD OF DYNAMICALLY ENABLING ADDITIONAL SENSORS BASED UPON INITIAL SENSOR DATA, AND SYSTEM FOR ACCOMPLISHING SAME

(75) Inventors: Sam H. Allen, Jr., New Braunfels, TX (US); Elfido Coss, Jr., Austin, TX (US); Michael R. Conboy, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 271 days.

(21) Appl. No.: 10/060,455

(22) Filed: Jan. 30, 2002

(51) Int. Cl.$^7$ .............................................. G06F 11/32
(52) U.S. Cl. ........................................ 702/183; 438/5
(58) Field of Search ............................ 702/183, 35, 58, 702/50, 81, 84, 182, 185; 438/5, 8, 9, 10, 12, 14, 609; 134/1.2, 1.3, 11, 56 R

(56) References Cited

U.S. PATENT DOCUMENTS 5,887,602 A * 3/1999 Iwama ......................... 134/43

* cited by examiner

*Primary Examiner*—Marc S. Hoff
*Assistant Examiner*—Edward Raymond
(74) *Attorney, Agent, or Firm*—Williams, Morgan & Amerson, P.C.

(57) ABSTRACT

The present invention is generally directed to method of dynamically enabling additional sensors based upon initial sensor data, and a system for accomplishing same. In one illustrative embodiment, the method comprises initiating a process operation in a process tool, determining if an abnormal process event has occurred in the process operation based upon data sensed by at least one control sensor, enabling at least one additional sensor to acquire additional data related to the process operation if an abnormal process event is determined to have occurred and obtaining data from the enabled additional sensor. In another illustrative embodiment, the present invention is directed to a system that comprises a process tool adapted to perform a process operation, at least one control sensor adapted to sense a parameter indicative of the process operation performed in the process tool and a controller for receiving data from the at least one control sensor and determining if an abnormal process event has occurred based upon the data, the controller further adapted to enable at least one additional sensor adapted to acquire additional data related to the process operation if an abnormal process event has occurred.

69 Claims, 1 Drawing Sheet

METHOD OF DYNAMICALLY ENABLING ADDITIONAL SENSORS BASED UPON INITIAL SENSOR DATA, AND SYSTEM FOR ACCOMPLISHING SAME

BACKGROUND OF THE INVENTION

1. Field of the Invention

This invention relates generally to the field of semiconductor device manufacturing and, more particularly, to a method of dynamically enabling additional sensors based upon initial sensor data, and a system for accomplishing same.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Semiconductor devices are manufactured from wafers comprised of a semiconducting material. Layers of materials are added, removed, and/or treated during fabrication to create the electrical circuits that make up the device. The fabrication essentially comprises four basic operations. Although there are only four basic operations, they can be combined in hundreds of different ways, depending upon the particular fabrication process. Four operations typically used in the manufacture of semiconductor devices are:

layering, or adding thin layers of various materials to a wafer from which a semiconductor device is produced;

patterning, or removing selected portions of added layers;

doping, or placing specific amounts of dopants in the wafer surface through openings in the added layers; and heat treatment, or heating and cooling the materials to produce desired effects in the processed wafer.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Most modern integrated circuit device manufacturing facilities make great efforts in attempting to control the various process operations performed in manufacturing integrated circuit devices. Such efforts typically involve the collection of large amounts of data from a variety of sensors employed in the fabrication facility. These sensors may be integrated within the various processing tools, or they may be part of various offline metrology tools. The data for such sensors may be collected on a routine or random basis. At least some of the data obtained by the sensors is typically stored, at least for some period of time, in one or more databases. Some of the data collected may not be stored for any significant duration. For example, collected data that indicates that the monitored process is performing within an acceptable operating range may be discarded after a period of time.

Unfortunately, managing all of this data can be difficult, time-consuming and expensive. Moreover, despite all the data being collected on a more or less consistent basis, such data may not be helpful in pinpointing the cause of a particular processing problem. That is, in some instances, additional and/or different types of metrology data may need to be collected to assist in the analysis of any particular processing problem.

The present invention is directed to overcoming, or at least reducing the effects of, one or more of the problems set forth above.

SUMMARY OF THE INVENTION

The present invention is generally directed to various methods of dynamically enabling additional sensors based upon initial sensor data, and a system for accomplishing same. In one illustrative embodiment, the method comprises initiating a process operation in a process tool, determining if an abnormal process event has occurred in the process operation based upon data sensed by at least one control sensor, enabling at least one additional sensor to acquire additional data related to the process operation if an abnormal process event is determined to have occurred and obtaining data from the enabled additional sensor.

In another illustrative embodiment, the method comprises initiating a process operation in a process tool, operating a controller that determines if an abnormal process event has occurred in the process operation based upon data sensed by at least one control sensor and enables at least one additional sensor to acquire additional data related to the process operation if an abnormal process event is determined to have occurred. The method continues with providing the controller with data sensed by the enabled at least one additional sensor.

In another illustrative embodiment, the present invention is directed to a system that comprises a process tool adapted to perform a process operation, at least one control sensor adapted to sense a parameter indicative of the process operation performed in the process tool and a controller for receiving data from the at least one control sensor and determining if an abnormal process event has occurred based upon the data received from the control sensor. The controller is further adapted to enable at least one additional sensor adapted to acquire additional data related to the process operation if an abnormal process event has occurred.

BRIEF DESCRIPTION OF THE DRAWINGS

The invention may be understood by reference to the following description taken in conjunction with the accompanying drawings, in which like reference numerals identify like elements, and in which.

Figure 1:
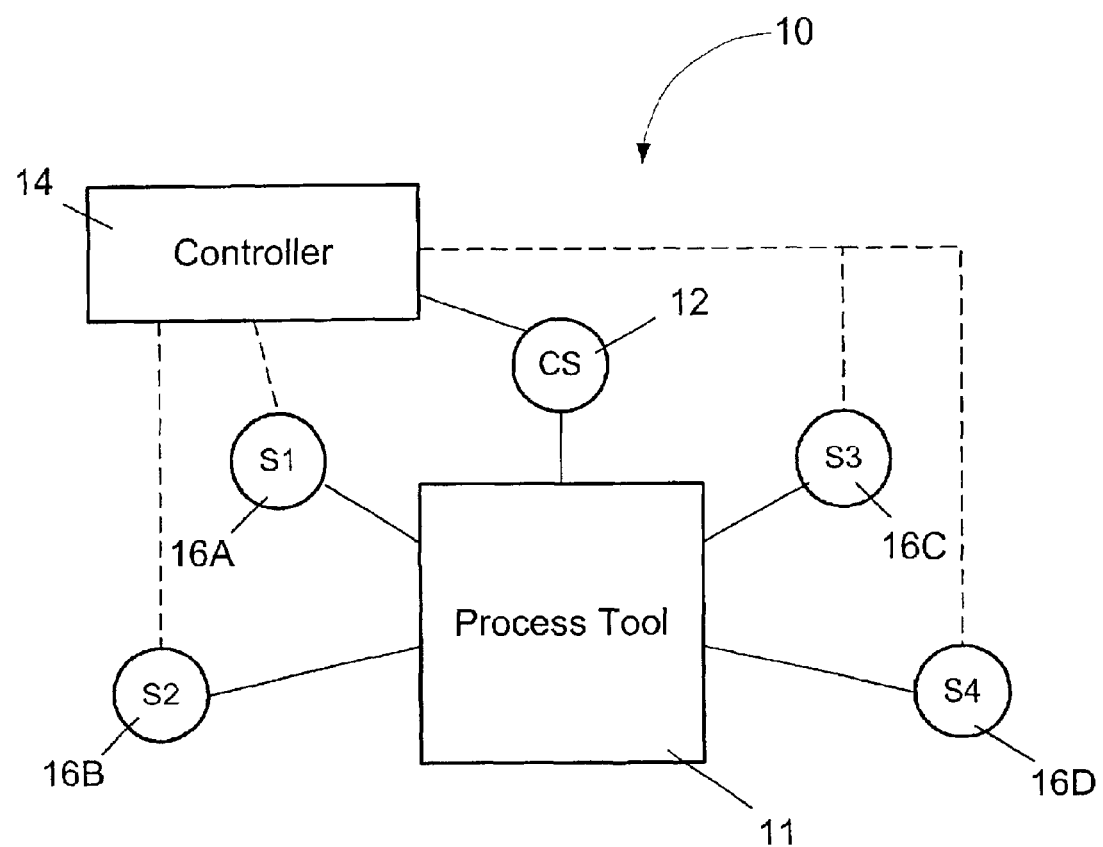
FIG. 1 is a diagram of an illustrative system that may be employed in performing one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. For purposes of clarity, the illustrative system depicted herein does not include all of the supporting utilities and devices of such a system. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to a method of dynamically enabling additional sensors based upon initial sensor data, and a system for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc. Moreover, the present invention may be employed with a vast variety of different types of processing tools and operations.

FIG. 1 depicts an illustrative system 10 that may be used in performing various illustrative embodiments of the invention disclosed herein. As shown therein, the system 10 is generally comprised of a process tool 11, a control sensor (CS) 12, a controller 14, and a plurality of additional sensors ($S_1$–$S_4$) 16A–D. The number of sensors depicted in FIG. 1 are depicted by way of example only. As will be recognized by those skilled in the art after a complete reading of the present application, the number of sensors and type of data collected by the sensors may vary greatly depending upon the processing operations performed in the process tool 11.

The process tool 11 may be any type of process tool used in the manufacture of integrated circuit devices. For example, the process tool 11 may be a deposition tool, an etching tool, a photolithography module, a stepper, a furnace, a rapid thermal anneal chamber, an ion implant tool, a chemical mechanical polishing tool, etc. Thus, the particular invention should not be considered as limited to any particular type of process tool unless such limitations are expressly recited in the appended claims. Moreover, it should be understood that the present invention may be employed in forming a vast variety of different types of integrated circuit devices.

The control sensor 12 may be any type of sensor or metrology tool used for collecting data, and it may collect a variety of different types of data depending on the processing operations performed in the process tool 11. Moreover, the control sensor 12 need not be integral with the process tool 11. The data collected by the control sensor 12 is indicative of the process performed in the process tool 11. For example, in the case where the process tool 11 is a deposition tool, the control sensor 12 may monitor the thickness of the layer deposited on a wafer in the process tool 11. In the case where the process tool 11 is a furnace, the control sensor 12 may monitor the temperature in the process tool 11, or the rate of temperature rise/fall within the process tool 11. In short, the parameters sensed by the control sensor 12 will vary depending upon the type of process performed in the process tool 11. Of course, the control sensor 12 may sense more than one parameter.

Moreover, although a single control sensor 12 is depicted in FIG. 1, those skilled in the art will understand after a complete reading of the present application that multiple sensors may be employed as control sensors in the context of the present invention. That is, as explained more fully below, data may be collected from multiple control sensors and provided to the controller 14. Thereafter, the controller 14 may analyze the data collected from one or more of the control sensors 12 and take various control actions to be described more fully below.

The additional sensors 16A–D are also operatively coupled to the controller 14, and they are capable of sensing data that may be useful in monitoring the process operations performed in the process tool 11. The sensors 16A–D may be configured and positioned to sense a variety of different types of data as deemed appropriate by the responsible. process engineer. For example, in the case where the process tool 11 is a deposition tool, the sensors 16A–D may be configured so as to sense the pressure and/or temperature of one or more process gases supplied to the process tool 11, the ambient air conditions surrounding the process tool 11, the rate of temperature increases or decreases within the process gas streams, gas flow rates and fluctuations thereof, etc. In the case where the process tool 11 is the track portion of a photolithography module, the sensors 16A–D may monitor data such as the viscosity of the photoresist material, the spin rate of the spinning plate, pre-exposure bake temperatures or changes in temperature, etc. In a very general sense, the sensors 16A–D will be used to monitor very detailed aspects of factors or conditions that may have an impact on the results of the process performed in the process tool 11.

The controller 14 is adapted to receive data from the control sensor 12 and take various control actions in response to such data, as described more fully below. In the illustrated embodiment, the controller 14 is a computer programmed with software to implement the functions described. However, as will be appreciated by those of ordinary skill in the art, a hardware controller designed to implement the particular functions may also be used. Moreover, the functions performed by the controller 14, as described herein, may be performed by multiple controller devices distributed throughout a system. Additionally, the controller 14 may be a stand-alone controller, it may be integrated into a tool, such as the process tool 11, or the control sensor 12, or it may be part of a computer system controlling operations in an integrated circuit manufacturing facility.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 14, as described, is the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional—Specification for CIM Framework Advanced Process Control Component) specifications are publicly available from SEMI.

One illustrative aspect of the operation of the present invention will now be described. A typical process operation will normally have an acceptable operating range wherein the results of the operation produce acceptable results. Exactly how this acceptable range is defined will vary depending upon a variety of factors, e.g., the type of integrated circuit device under construction, the type of process operation involved, etc. At various times, and for a variety of reasons, an abnormal process event may occur during the processing operations performed in the process tool 11. An abnormal process event is an event wherein the process operation produces results that are outside of a preselected acceptable range. When the data received from the control sensor 12 indicates that an abnormal process event has occurred with respect to the operation performed in the process tool 11, the controller 14 may enable one or more of the additional sensors 16A–D to begin collecting additional data that may be worth considering in trying to determine the cause of the abnormal process event that occurred in the process tool 11. For example, in the case where the process tool 11 is a deposition tool, the control sensor 12 may sense the thickness of a process layer formed in the process tool 11. An abnormal process event may be deemed to have occurred if the sensed thickness of the process layer formed in the process tool 11 falls outside of an acceptable range of values. At that time, the controller 14 may then enable one or more of the additional sensors 16A–D to accumulate additional, more detailed data regarding factors that may have caused the processing abnormality in the process tool 11. For example, the additional sensors 16A–D may be used to sense process gas flow rates and pressures, and variations over time of the gas flow rates and pressures, etc. One or more of the sensors 16A–D may also be used to sense impurity levels in the process gas streams.

As another example, the process tool 11 may be a track portion of a typical photolithography module. The control sensor 12 may be used to measure the thickness of a layer of photoresist after a pre-exposure bake process. If the sensed thickness falls outside of a preselected acceptable range of values, an abnormal process event may be deemed to have occurred. At that time, the controller 14 may then enable one or more of the additional sensors 16A–D to obtain additional data that may be useful in determining the cause of the abnormal process event. For example, the sensors 16A–D may be used to obtain data regarding the viscosity of the photoresist material, the temperature of the photoresist material, the surround ambient conditions in the fabrication facility, humidity levels in the fabrication plant, the speed of the spinning plate and variations of that speed over time, etc.

In short, the controller 14 receives data from the control sensor 12 and, in the case where the data received from the control sensor 12 indicates an abnormal process event has occurred, the controller 14 then dynamically enables one or more additional sensors to gather additional data that may be useful in determining the cause of the abnormal process event. That is, through use of the present invention, the additional sensors 16A–D are enabled only after data sensed by the control sensor 12 indicates that an abnormal process event has occurred. By dynamically enabling the additional sensors 16A–D as described herein, several benefits are achieved. For example, the data obtained by the sensors 16A–D may only be important in the context of trying to determine the cause of an abnormal process event. If the data collected by the sensors 16A–D, data which is sometimes very detailed data, were monitored continuously throughout every process operation, the amount of data to be stored, analyzed and manipulated in a modern semiconductor manufacturing facility would prove to be very large and cumbersome to handle. Moreover, in most cases, the detailed data sensed by the additional sensors 16A–D is of primary interest only when an abnormal process event has occurred and the cause of such an event is under investigation. However, if desired, the sensors 16A–D could be enabled on a periodic basis without the occurrence of an abnormal process event as part of an overall system check.

As should be understood from the above discussion, the present invention may be employed in a vast variety of processes. Moreover, although a single control sensor 12 is depicted in the drawings, it should be understood that the depicted control sensor 12 is representative in nature and that the controller 14 may receive input from multiple control sensors. That is, the controller 14 may receive input from multiple control sensors 12 and, based upon an analysis of the data received from the multiple control sensors, determine or recognize that an abnormal process event has occurred in the process tool 11. At that time, the controller 14, applying various rules or algorithms, may then enable one or more of the additional sensors 16A–D at various time to acquire additional data regarding the operations performed in the process tool 11.

The controller 14 may continue to collect data from the control sensor 12 and/or the additional sensors 16A–D for any desired length of time. For example, the controller 14 may be programmed to collect the additional data from sensors 16A–D for an additional set number of processing cycles performed in the process tool 11, e.g., two more processing cycles, or it may continue to collect the additional data from the additional sensors 16A–D until such time as the parameter sensed by the control sensor 12 indicates that the processing abnormality in the process tool 11 is no longer occurring. Thus, the precise rules used by the controller 14 regarding the initiation and duration of the enablement of the additional sensors 16A–D may be varied depending upon the particular processing operations. For example, if the data obtained from the control sensor 12 indicates that the processing abnormality is just slightly outside of acceptable limits, the controller 14 may enable the appropriate additional sensors 16A–D and monitor the data obtained from those additional sensors 16A–D for an additional number of process cycles. However, if the data sensed by the control sensor 12 indicates that the processing abnormality greatly exceeds allowable limits, the controller 14 may then able the appropriate additional sensors 16A–D for one additional processing cycle. Thus, the particular rules by which the controller 14 performs its various control functions should not be considered a limitation of the present invention unless such limitations are clearly set forth in the appended claims.

The present invention is generally directed to various methods of dynamically enabling additional sensors based upon initial sensor data, and a system for accomplishing same. In one illustrative embodiment, the method comprises initiating a process operation in a process tool, determining if an abnormal process event has occurred in the process operation based upon data sensed by the control sensor, enabling at least one additional sensor to acquire additional data related to the process operation if an abnormal process event is determined to have occurred and obtaining data from the enabled additional sensor.

In another illustrative embodiment, the method comprises initiating a process operation in a process tool, operating a controller that determines if an abnormal process event has occurred in the process operation based upon data sensed by at least one control sensor and enables at least one additional sensor to acquire additional data related to the process operation if an abnormal process event is determined to have occurred. The method further comprises providing the controller with data sensed by the enabled sensor.

In another illustrative embodiment, the present invention is directed to a system that comprises a process tool adapted to perform a process operation, at least one control sensor adapted to sense a parameter indicative of the process operation performed in the process tool and a controller for receiving data from the control sensor and determining if an abnormal process event has occurred based upon the data received from the control sensor. The controller is further adapted to enable at least one additional sensor adapted to acquire additional data related to the process operation if an abnormal process event has occurred.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

initiating a process operation in a process tool;

determining if an abnormal process event has occurred in said process operation based upon data sensed by at least one control sensor;

enabling at least one additional sensor to acquire additional data related to said process operation if an abnormal process event is determined to have occurred; and obtaining data from said enabled at least one additional sensor for a duration of at least one additional cycle of performing said process operation in said process tool.

2. The method of claim 1, wherein initiating a process operation in a process tool comprises initiating a process operation in a process tool comprised of at least one of a deposition tool, an etching tool, an ion implant tool, a track portion of a photolithography tool, a stepper, a furnace, a rapid thermal anneal tool and a chemical mechanical polishing tool.

3. The method of claim 1, wherein initiating a process operation in a process tool comprises initiating a process operation comprised of at least one of a deposition process, an etching process, an ion implantation process, a heating process and a chemical mechanical polishing process.

4. The method of claim 1, wherein determining if an abnormal process event has occurred in said process operation based upon data sensed by at least one control sensor comprises determining if an abnormal process event has occurred in said process operation based upon data sensed by a plurality of control sensors.

5. The method of claim 1, wherein enabling at least one additional sensor to acquire additional data related to said process operation if an abnormal process event is determined to have occurred comprises enabling a plurality of additional sensors to acquire additional data related to said process operation if an abnormal process event is determined to have occurred.

6. The method of claim 1, wherein said process tool is a deposition tool and wherein said at least one control sensor is adapted to sense a thickness of a process layer formed in said deposition tool.

7. The method of claim 6, wherein said at least one additional sensor is adapted to sense at least one of a process gas flow rate, a variation over time of a process gas flow rate, a process gas temperature, a variation over time of a process gas temperature, ambient air conditions adjacent said process tool and impurities in a process gas stream.

8. The method of claim 1, wherein said process tool is a track portion of a photolithography module and said at least one control sensor is adapted to sense a thickness of a layer of photoresist after a pre-exposure bake process has been performed.

9. The method of claim 8, wherein said at least one additional sensor is adapted to sense at least one of a temperature of a photoresist material, a viscosity of a photoresist material, a spinning speed of a spinning plate of said track portion and a pre-exposure bake temperature.

10. The method of claim 1, further comprising disabling said at least one enabled sensor if data obtained by said at least one control sensor indicates that said processing operation is performing within acceptable limits.

11. A method, comprising:
initiating a process operation in a process tool, said process tool comprised of at least one of a deposition tool, an etching tool, an ion implant tool, a track portion of a photolithography tool, a stepper, a furnace, a rapid thermal anneal tool and a chemical mechanical polishing tool;
determining if an abnormal process event has occurred in said process operation based upon data sensed by at least one control sensor;
enabling a plurality of additional sensors to acquire additional data related to said process operation if an abnormal process event is determined to have occurred; and
obtaining data from said enabled additional sensors for a duration of at least one additional cycle of performing said process operation in said process tool.

12. The method of claim 11, wherein determining if an abnormal process event has occurred in said process operation based upon data sensed by at least one control sensor comprises determining if an abnormal process event has occurred in said process operation based upon data sensed by a plurality of control sensors.

13. The method of claim 11, wherein said process tool is a deposition tool and wherein said at least one control sensor is adapted to sense a thickness of a process layer formed in said deposition tool.

14. The method of claim 13, wherein at least one of said additional sensors is adapted to sense at least one of a process gas flow rate, a variation over time of a process gas flow rate, a process gas temperature, a variation over time of a process gas temperature, ambient air conditions adjacent said process tool and impurities in a process gas stream.

15. The method of claim 11, wherein said process tool is a track portion of a photolithography module and said at least one control sensor is adapted to sense a thickness of a layer of photoresist after a pre-exposure bake process has been performed.

16. The method of claim 15, wherein at least one of said additional sensors is adapted to sense at least one of a temperature of a photoresist material, a viscosity of a photoresist material, a spinning speed of a spinning plate of said track portion and a pre-exposure bake temperature.

17. The method of claim 11, further comprising disabling said at least one enabled sensor if data obtained by said at least one control sensor indicates that said processing operation is performing within acceptable limits.

18. A method, comprising:
initiating a process operation in a process tool;
determining if an abnormal process event has occurred in said process operation based upon data sensed by a plurality of control sensors;
enabling a plurality of additional sensors to acquire additional data related to said process operation if an abnormal process event is determined to have occurred; and
obtaining data from said enabled additional sensors for a duration of at least one additional cycle of performing said process operation in said process tool.

19. The method of claim 18, wherein initiating a process operation in a process tool comprises initiating a process operation in a process tool, said process tool comprised of at least one of a deposition tool, an etching tool, an ion implant tool, a track portion of a photolithography tool, a stepper, a furnace, a rapid thermal anneal tool and a chemical mechanical polishing tool.

20. The method of claim 18, wherein initiating a process operation in a process tool comprises initiating a process operation in a process tool, said process operation comprised of at least one of a deposition process, an etching process, an ion implantation process, a heating process and a chemical mechanical polishing process.

21. The method of claim 18, wherein said process tool is a deposition tool and wherein at least one of said control sensors is adapted to sense a thickness of a process layer formed in said deposition tool.

22. The method of claim 21, wherein at least one of said additional sensors is adapted to sense at least one of a process gas flow rate, a variation over time of a process gas flow rate, a process gas temperature, a variation over time of a process gas temperature, ambient air conditions adjacent said process tool and impurities in a process gas stream.

23. The method of claim 18, wherein said process tool is a track portion of a photolithography module and at least one of said control sensors is adapted to sense a thickness of a layer of photoresist after a pre-exposure bake process has been performed.

24. The method of claim 23, wherein at least one of said additional sensors is adapted to sense at least one of a temperature of a photoresist material, a viscosity of a photoresist material, a spinning speed of a spinning plate of said track portion and a pre-exposure bake temperature.

25. The method of claim 18, further comprising disabling at least one of said enabled sensors if data obtained by said plurality of control sensors indicates that said processing operation is performing within acceptable limits.

26. A method, comprising:
initiating a process operation in a process tool;
operating a controller that determines if an abnormal process event has occurred in said process operation based upon data sensed by at least one control sensor, said controller enabling at least one additional sensor to acquire additional data related to said process operation if an abnormal process event is determined to have occurred; and
providing said controller with data sensed by said enabled at least one additional sensor for a duration of at least one additional cycle of performing said process operation in said process tool.

27. The method of claim 26, wherein initiating a process operation in a process tool comprises initiating a process operation in a process tool comprised of at least one of a deposition tool, an etching tool, an ion implant tool, a track portion of a photolithography tool, a stepper, a furnace, a rapid thermal anneal tool and a chemical mechanical polishing tool.

28. The method of claim 26, wherein initiating a process operation in a process tool comprises initiating a process operation comprised of at least one of a deposition process, an etching process, an ion implantation process, a heating process and a chemical mechanical polishing process.

29. The method of claim 26, wherein operating a controller that determines if an abnormal process event has occurred in said process operation based upon data sensed by at least one control sensor comprises operating a controller that determines if an abnormal process event has occurred in said process operation based upon data sensed by a plurality of control sensors.

30. The method of claim 26, wherein enabling at least one additional sensor to acquire additional data related to said process operation if an abnormal process event is determined to have occurred comprises enabling a plurality of additional sensors to acquire additional data related to said process operation if an abnormal process event is determined to have occurred.

31. The method of claim 26, wherein said process tool is a deposition tool and wherein said at least one control sensor is adapted to sense a thickness of a process layer formed in said deposition tool.

32. The method of claim 31, wherein said at least one additional sensor is adapted to sense at least one of a process gas flow rate, a variation over time of a process gas flow rate, a process gas temperature, a variation over time of a process gas temperature, ambient air conditions adjacent said process tool and impurities in a process gas stream.

33. The method of claim 26, wherein said process tool is a track portion of a photolithography module and said at least one control sensor is adapted to sense a thickness of a layer of photoresist after a pre-exposure bake process has been performed.

34. The method of claim 33, wherein said at least one additional sensor is adapted to sense at least one of a temperature of a photoresist material, a viscosity of a photoresist material, a spinning speed of a spinning plate of said track portion and a pre-exposure bake temperature.

35. The method of claim 26, further comprising disabling said at least one enabled sensor if data obtained by said at least one control sensor indicates that said processing operation is performing within acceptable limits.

36. A system, comprising:
a process tool adapted to perform a process operation, wherein said process tool is a deposition tool;
at least one control sensor adapted to sense a parameter indicative of said process operation performed in said process tool; and
a controller for receiving data from said at least one control sensor and determining if an abnormal process event has occurred based upon said data received from said at least one control sensor, wherein said control sensor is adapted to sense a thickness of a process layer deposited in said process tool, said controller further adapted to enable at least one additional sensor that is adapted to acquire additional data related to said process operation if an abnormal process event has occurred.

37. The system of claim 36, wherein said at least one additional sensor is adapted to sense at least one of a process gas flow rate, a variation over time of a process gas flow rate, a process gas temperature, a variation over time of a process gas temperature, ambient air conditions adjacent said process tool and impurities in a process gas stream.

38. The system of claim 36, wherein said at least one control sensor comprises a plurality of control sensors.

39. The system of claim 36, wherein said at least one additional sensor comprises a plurality of additional sensors.

40. The system of claim 36, wherein said controller is a stand-alone controller.

41. The system of claim 36, wherein said controller is part of said at least one control sensor.

42. The system of claim 36, wherein said controller is resident on said process tool.

43. A method, comprising:
initiating a process operation in a process tool;
determining if an abnormal process event has occurred in said process operation based upon data sensed by at least one control sensor;
enabling at least one additional sensor to acquire additional data related to said process operation if an abnormal process event is determined to have occurred;
obtaining data from said enabled at least one additional sensor; and
disabling said at least one enabled sensor if data obtained by said at least one control sensor indicates that said processing operation is performing within acceptable limits.

44. A method, comprising:
initiating a process operation in a process tool, wherein said process tool is a deposition tool;
determining if an abnormal process event has occurred in said process operation based upon data sensed by at least one control sensor, wherein said at least one control sensor is adapted to sense a thickness of a process layer formed in said deposition tool;
enabling at least one additional sensor to acquire additional data related to said process operation if an abnormal process event is determined to have occurred; and
obtaining data from said enabled at least one additional sensor.

45. The method of claim 44, wherein said at least one additional sensor is adapted to sense at least one of a process gas flow rate, a variation over time of a process gas flow rate, a process gas temperature, a variation over time of a process gas temperature, ambient air conditions adjacent said process tool and impurities in a process gas stream.

46. A method, comprising:
initiating a process operation in a process tool, wherein said process tool is a track portion of a photolithography module;
determining if an abnormal process event has occurred in said process operation based upon data sensed by at least one control sensor, wherein said at least one control sensor is adapted to sense a thickness of a layer of photoresist after a pre-exposure bake process has been performed;
enabling at least one additional sensor to acquire additional data related to said process operation if an abnormal process event is determined to have occurred; and
obtaining data from said enabled at least one additional sensor.

47. The method of claim 46, wherein said at least one additional sensor is adapted to sense at least one of a temperature of a photoresist material, a viscosity of a photoresist material, a spinning speed of a spinning plate of said track portion and a pre-exposure bake temperature.

48. A method, comprising:
initiating a process operation in a process tool, said process tool comprised of at least one of a deposition tool, an etching tool, an ion implant tool, a track portion of a photolithography tool, a stepper, a furnace, a rapid thermal anneal tool and a chemical mechanical polishing tool;
determining if an abnormal process event has occurred in said process operation based upon data sensed by at least one control sensor;

enabling a plurality of additional sensors to acquire additional data related to said process operation if an abnormal process event is determined to have occurred;

obtaining data from said enabled additional sensors; and disabling said at least one enabled sensor if data obtained by said at least one control sensor indicates that said processing operation is performing within acceptable limits.

49. A method, comprising:

initiating a process operation in a process tool, wherein said process tool is a deposition tool;

determining if an abnormal process event has occurred in said process operation based upon data sensed by at least one control sensor, wherein said at least one control sensor is adapted to sense a thickness of a process layer formed in said deposition tool;

enabling a plurality of additional sensors to acquire additional data related to said process operation if an abnormal process event is determined to have occurred; and obtaining data from said enabled additional sensors.

50. The method of claim 49, wherein at least one of said additional sensors is adapted to sense at least one of a process gas flow rate, a variation over time of a process gas flow rate, a process gas temperature, a variation over time of a process gas temperature, ambient air conditions adjacent said process tool and impurities in a process gas stream.

51. A method, comprising:

initiating a process operation in a process tool, wherein said process tool is a track portion of a photolithography module;

determining if an abnormal process event has occurred in said process operation based upon data sensed by at least one control sensor, wherein said at least one control sensor is adapted to sense a thickness of a layer of photoresist after a pre-exposure bake process has been performed;

enabling a plurality of additional sensors to acquire additional data related to said process operation if an abnormal process event is determined to have occurred; and obtaining data from said enabled additional sensors.

52. The method of claim 51, wherein at least one of said additional sensors is adapted to sense at least one of a temperature of a photoresist material, a viscosity of a photoresist material, a spinning speed of a spinning plate of said track portion and a pre-exposure bake temperature.

53. A method, comprising:

initiating a process operation in a process tool;

determining if an abnormal process event has occurred in said process operation based upon data sensed by a plurality of control sensors;

enabling a plurality of additional sensors to acquire additional data related to said process operation if an abnormal process event is determined to have occurred;

obtaining data from said enabled additional sensors; and disabling at least one of said enabled sensors if data obtained by said plurality of control sensors indicates that said processing operation is performing within acceptable limits.

54. A method, comprising:

initiating a process operation in a process tool, wherein said process tool is a deposition tool;

determining if an abnormal process event has occurred in said process operation based upon data sensed by a plurality of control sensors, wherein at least one of said control sensors is adapted to sense a thickness of a process layer formed in said deposition tool;

enabling a plurality of additional sensors to acquire additional data related to said process operation if an abnormal process event is determined to have occurred; and obtaining data from said enabled additional sensors.

55. The method of claim 54, wherein at least one of said additional sensors is adapted to sense at least one of a process gas flow rate, a variation over time of a process gas flow rate, a process gas temperature, a variation over time of a process gas temperature, ambient air conditions adjacent said process tool and impurities in a process gas stream.

56. A method, comprising:

initiating a process operation in a process tool, wherein said process tool is a track portion of a photolithography module;

determining if an abnormal process event has occurred in said process operation based upon data sensed by a plurality of control sensors, wherein at least one of said control sensors is adapted to sense a thickness of a layer of photoresist after a pre-exposure bake process has been performed;

enabling a plurality of additional sensors to acquire additional data related to said process operation if an abnormal process event is determined to have occurred; and obtaining data from said enabled additional sensors.

57. The method of claim 56, wherein at least one of said additional sensors is adapted to sense at least one of a temperature of a photoresist material, a viscosity of a photoresist material, a spinning speed of a spinning plate of said track portion and a pre-exposure bake temperature.

58. A method, comprising:

initiating a process operation in a process tool, wherein said process tool is a deposition tool;

operating a controller that determines if an abnormal process event has occurred in said process operation based upon data sensed by at least one control sensor, wherein said at least one control sensor is adapted to sense a thickness of a process layer formed in said deposition tool, said controller enabling at least one additional sensor to acquire additional data related to said process operation if an abnormal process event is determined to have occurred; and providing said controller with data sensed by said enabled at least one additional sensor.

59. The method of claim 58, wherein said at least one additional sensor is adapted to sense at least one of a process gas flow rate, a variation over time of a process gas flow rate, a process gas temperature, a variation over time of a process gas temperature, ambient air conditions adjacent said process tool and impurities in a process gas stream.

60. A method, comprising:

initiating a process operation in a process tool, wherein said process tool is a track portion of a photolithography module;

operating a controller that determines if an abnormal process event has occurred in said process operation based upon data sensed by at least one control sensor, wherein said at least one control sensor is adapted to sense a thickness of a layer of photoresist after a pre-exposure bake process has been performed, said controller enabling at least one additional sensor to acquire additional data related to said process operation if an abnormal process event is determined to have occurred; and providing said controller with data sensed by said enabled at least one additional sensor.

61. The method of claim 60, wherein said at least one additional sensor is adapted to sense at least one of a temperature of a photoresist material, a viscosity of a photoresist material, a spinning speed of a spinning plate of said track portion and a pre-exposure bake temperature.

62. A method, comprising:

initiating a process operation in a process tool;

operating a controller that determines if an abnormal process event has occurred in said process operation based upon data sensed by at least one control sensor, said controller enabling at least one additional sensor to acquire additional data related to said process operation if an abnormal process event is determined to have occurred;

providing said controller with data sensed by said enabled at least one additional sensor; and disabling said at least one enabled sensor if data obtained by said at least one control sensor indicates that said processing operation is performing within acceptable limits.

63. A system, comprising:

a process tool adapted to perform a process operation, wherein said process tool is a track portion of a photolithography module;

at least one control sensor adapted to sense a parameter indicative of said process operation performed in said process tool; and a controller for receiving data from said at least one control sensor and determining if an abnormal process event has occurred based upon said data received from said at least one control sensor, wherein said at least one control sensor is adapted to sense a thickness of a layer of photoresist after a pre-exposure bake process has been performed, said controller further adapted to enable at least one additional sensor that is adapted to acquire additional data related to said process operation if an abnormal process event has occurred.

64. The system of claim 63, wherein said at least one additional sensor is adapted to sense at least one of a temperature of a photoresist material, a viscosity of a photoresist material, a spinning speed of a spinning plate of said track portion and a pre-exposure bake temperature.

65. The system of claim 63, wherein said at least one control sensor comprises a plurality of control sensors.

66. The system of claim 63, wherein said at least one additional sensor comprises a plurality of additional sensors.

67. The system of claim 63, wherein said controller is a stand-alone controller.

68. The system of claim 63, wherein said controller is part of said at least one control sensor.

69. The system of claim 63, wherein said controller is resident on said process tool.

* * * * *